United States Patent
Perez

(10) Patent No.: US 10,326,457 B2
(45) Date of Patent: Jun. 18, 2019

(54) REFERENCE-LOCKED CLOCK GENERATOR

(71) Applicant: Innophase, Inc., San Diego, CA (US)

(72) Inventor: Roc Berenguer Perez, San Diego, CA (US)

(73) Assignee: Innophase, Inc., San Diego, CA (US)

( * ) Notice: Subject to any disclaimer, the term of this patent is extended or adjusted under 35 U.S.C. 154(b) by 0 days.

(21) Appl. No.: 15/675,384

(22) Filed: Aug. 11, 2017

(65) Prior Publication Data
US 2019/0052280 A1    Feb. 14, 2019

(51) Int. Cl.
*H03L 7/099*    (2006.01)
(52) U.S. Cl.
CPC ................. *H03L 7/0997* (2013.01)
(58) Field of Classification Search
CPC ......... H03L 7/00; H03L 7/099; H03L 7/0995; H03L 7/0997; H03L 7/0998; H03L 7/087; H03L 7/091; H03L 7/06
USPC ........................................ 327/156, 158, 161
See application file for complete search history.

(56) References Cited

U.S. PATENT DOCUMENTS

2011/0109356 A1*  5/2011  Ali .................. H03L 7/0816
                                                    327/158

OTHER PUBLICATIONS

Helal, Belal M. et al. "A Low Jitter Programmable Clock Multiplier Based on a Pulse Injection-Locked Oscillator With a Highly-Digital Tuning Loop" IEEE Journal of Solid-State Circuits, vol. 44, No. 5, p. 1391-1400. May 2009.
Poole, C. R. "Subharmonic Injection Locking Phenomena in Synchronous Oscillators" Electronics Letters, vol. 26, No. 21. pp. 1748-1750. Oct. 11, 1990.
Mesgarzadeh, Behzad, et al. "A Low-Power Digital DLL-Based Clock Generator in Open-Loop Mode" IEEE Journal of Solid-State Circuits, vol. 44, No. 7, pp. 1907-1913. Jul. 2009.
International Search Report and Written Opinion for PCT/US18142155, dated Aug. 23, 2018.

\* cited by examiner

*Primary Examiner* — John W Poos
(74) *Attorney, Agent, or Firm* — Invention Mine LLC

(57) ABSTRACT

Clock generation from an external reference by generating a reference clock gating signal using a reference clock gating circuit; enabling a ring-oscillator-injection mode using the reference clock gating signal to disable a first buffer of a ring oscillator and to enable a reference clock injection buffer, the first buffer and the injection buffer having parallel connected outputs that connect to a next buffer input; receiving a reference clock transition of a reference clock signal at the injection buffer and injecting it into the next buffer; and enabling a ring-oscillator-closed-loop mode by using the reference clock gating signal to enable the first buffer and to disable the reference clock injection buffer.

20 Claims, 7 Drawing Sheets

REFERENCE-LOCKED CLOCK GENERATOR

FIELD OF INVENTION

This invention relates generally to the field of Phase Locked Loops (PLLs).

BACKGROUND

Phase Locked Loops (PLLs) are generally used to synchronize a digital clock using an external reference. Typical PLLs that operate with closed-loop architectures can have bandwidth limitations causing slow frequency settling times. In high frequency clocking conditions such as in radio communications, a precision is required for digital logic circuits, like microprocessors. Precision and stability issues with high frequency clocking continue to require improvements in the art.

SUMMARY

A method includes, but is not limited to, generating a reference clock gating signal using a reference clock gating circuit; enabling a ring-oscillator-injection mode using the reference clock gating signal to disable a first buffer of a ring oscillator and to enable a reference clock injection buffer, the first buffer and the injection buffer having parallel connected outputs that connect to a next buffer input; receiving a reference clock transition of a reference clock signal at the injection buffer and injecting it into the next buffer; and enabling a ring-oscillator-closed-loop mode by using the reference clock gating signal to enable the first buffer and to disable the reference clock injection buffer. In addition to the foregoing, other method aspects are described in the claims, drawings, and text forming a part of the present disclosure.

An apparatus includes, but is not limited to, a buffer chain having a plurality of serially-connected buffer circuits and having a chain input and a chain output; a reference clock circuit; a ring multiplexer having an injection input connected to the reference clock circuit and a ring input connected to the chain output, a multiplexer output connected to the chain input, and an injection selection input; and a reference clock gating circuit connected to the injection selection input, the reference clock gating circuit configured to generate a reference clock gating signal on the injection selection input to selectively enable a reference clock signal from the reference clock circuit to be injected into the chain input. In addition to the foregoing, other apparatus aspects are described in the claims, drawings, and text forming a part of the present disclosure.

An apparatus includes a ring oscillator having a plurality of serially-connected buffers and a ring multiplexer, the serially-connected buffers being circularly connected via a ring input of the ring multiplexer; a reference clock circuit having a reference clock output connected to an injection input of the ring multiplexer; and a reference clock gating circuit connected to an output of the ring oscillator, and having a gating window output connected to the selection input of the ring multiplexer configured to selectively disconnect the ring input and connect the reference clock output to the ring oscillator to selectively inject a reference clock signal.

In one or more various aspects, related apparatus include but are not limited to circuitry and/or programming for effecting the herein referenced method aspects; the circuitry and/or programming can be virtually any combination of hardware, software, and/or firmware in one or more machines or article of manufacture configured to effect the herein referenced method aspects depending upon the design choices of the system designer.

DETAILED DESCRIPTION

Figure 1:
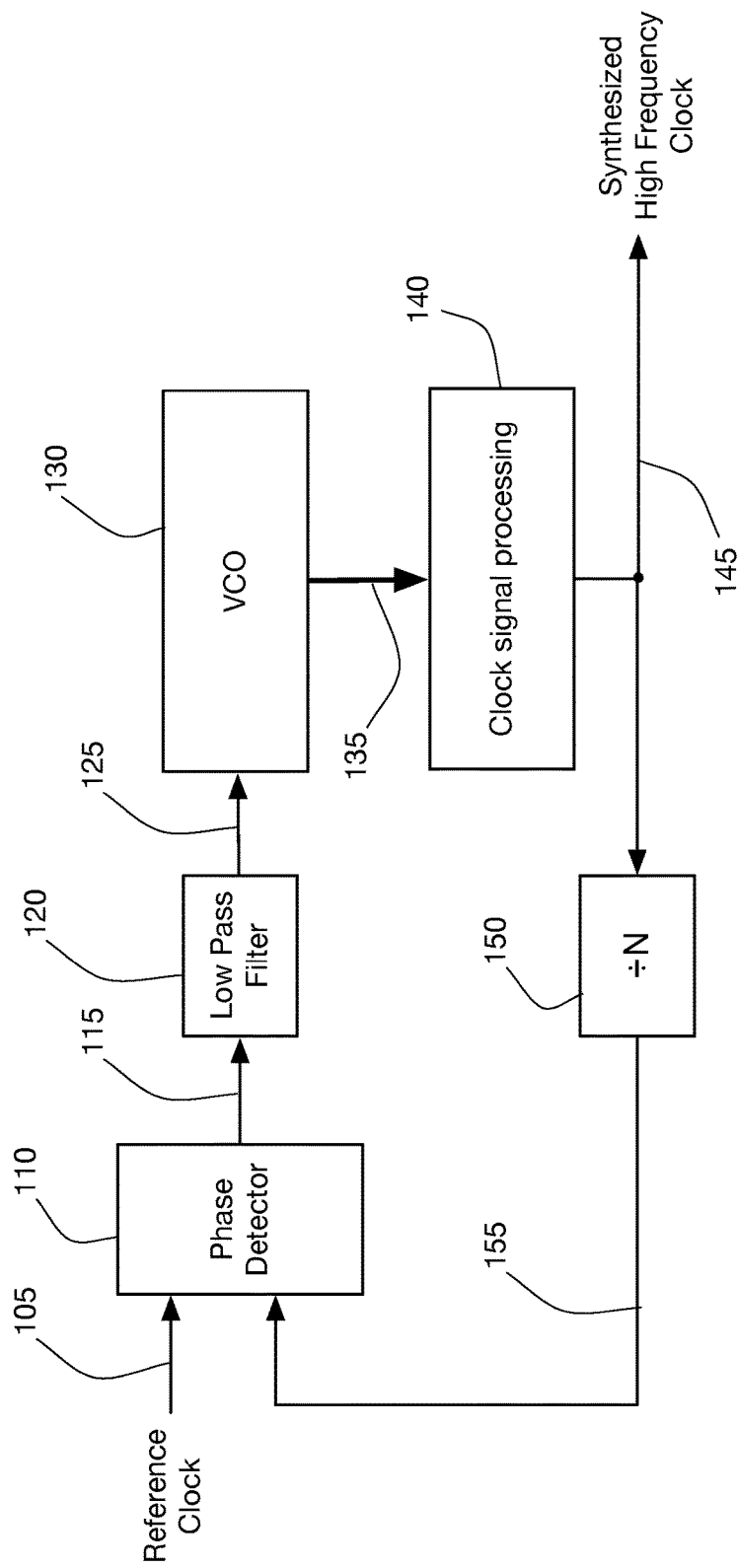
FIG. 1, labeled "Prior Art", illustrates a prior art Phase Locked Loop producing a Synthesized High Frequency Clock by frequency multiplication of a provided Reference Clock.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

FIG. 1, labeled "Prior Art" illustrates a phased locked loop (PLL), in which a Voltage Controlled Oscillator 130 generates a high frequency clock, which can be processed in Clock signal processing module 140 to produce a specific pulse duty cycle or waveform 145. Synthesized High Frequency Clock 145 can be made available to an external system, and fed back to be digitally reduced in rate by frequency divider 150, producing a low frequency internal clock 155 suitable for comparison with external Reference Clock 105. Phase Detector 110 performs the comparison.

In one example, Phase Detector module 110 compares the relative arrival times of transition edges of comparison inputs 105 and 155. In another example, Phase Detector module 110 receives inputs as digital square wave signals, and compares the relative differences or overlap of the two comparison inputs using a digital Exclusive Or (XOR) gate. Phase Detector module 110 produces an error output 115 indicating the relative phase difference detected. In these examples, the error output 115 can be a variable duty cycle digital signal, which when processed by Low Pass Filter 120 produces a variable amplitude analog signal 125 suitable for controlling the frequency of VCO 130.

Ring Oscillator VCO

Figure 2A:
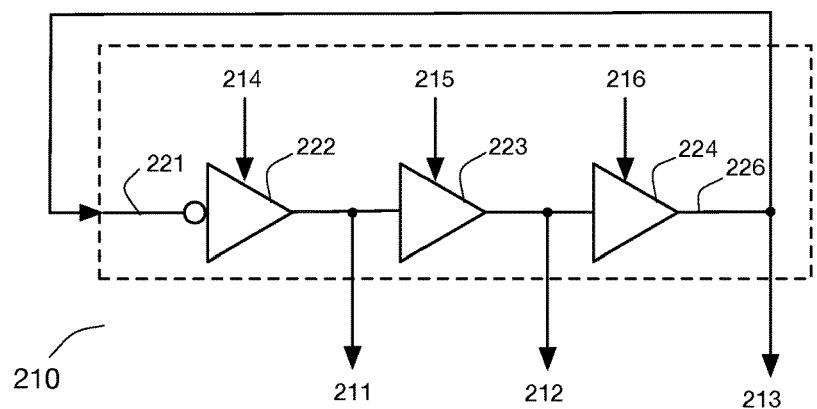
FIG. 2A, labeled "Prior Art" illustrates prior art Voltage Controlled Oscillators as used in the PLL of FIG. 1.
Figure 2B:
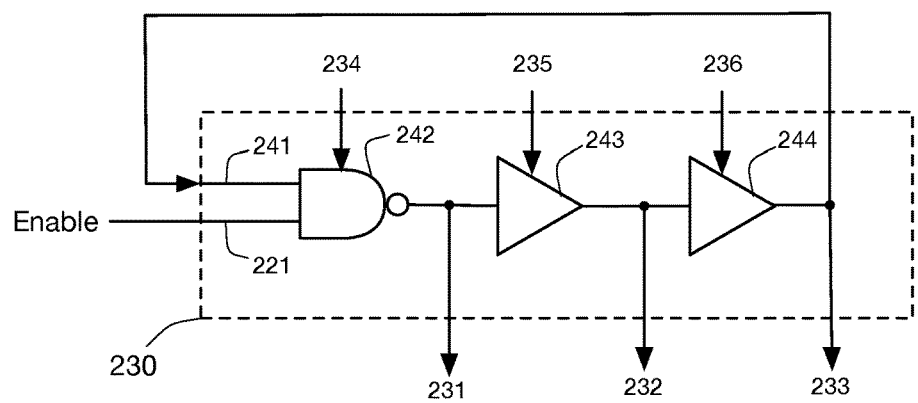
FIG. 2B, labeled "Prior Art" illustrates another prior art Voltage Controlled Oscillator as used in the PLL of FIG. 1.
Figure 2C:
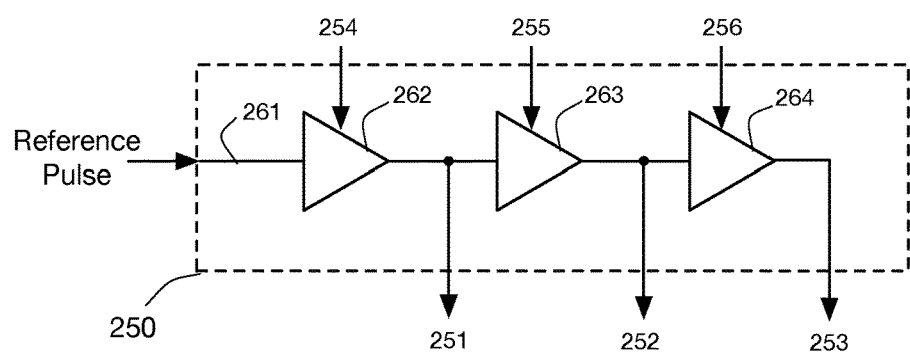
FIG. 2C, labeled "Prior Art" illustrates another prior art Voltage Controlled Oscillator as used in the PLL of FIG. 1.

As appreciated by one of skill in the art, a delay line or buffer chain ring oscillator can operate as the VCO in a Phase Locked Loop. In such oscillators, the inherent propagation delay of a digital logic gate or analog amplifier stage sets the oscillation rate for the circuit. FIGS. 2A, 2B and 2C, labeled "Prior Art" illustrate several examples.

Referring to FIG. 2A, Ring Oscillator 210 includes a plurality of series-connected buffer circuits, here shown as 222, 223, 224, having a chain input 221 and at least one chain output 226. Each buffer circuit has a propagation delay, with the overall sum of such delays in the series connection defining the duration of one half cycle of oscillation. To maintain oscillation, an odd number of logical inversions must occur between chain input and chain output, such that returning the chain output signal to the chain input will allow a continuing periodic oscillation to initiate and continue. In a practical embodiment, maintaining an odd number of logical inversions can be satisfied in numerous ways, including using an odd number of inverting buffers (here shown as three, without implying limitation,) or by configuring the interconnection of a series of differential buffers such that an odd number of inversions are performed. Multiple outputs, shown here as 211, 212, 213 can include multiple overlapping square wave clock phases, or can be processed by external logic to synthesize clocks having other duty cycles.

The frequency of a ring oscillator can be changed by changing the propagation delay of one or more elements. For example, the frequency of a ring oscillator can be changed by adding or removing resistive, capacitive, or inductive loads within or between stages. Additionally, the frequency of a ring oscillator can be changed by increasing or decreasing the output current driving the next stage. Also, the frequency of a ring oscillator can be changed by increasing or decreasing the switching threshold of the digital logic elements.

As shown in FIG. 2A, Voltages 214, 215, 216 are shown as enabling such adjustment for ring oscillator 210; Adjustments can also be accomplished by incorporating a combination of digitally switched configurations (as one example, adding fixed capacitance values), digitally controlled analog configurations (as through a Digital-to-Analog Converter (DAC) adjusting the operating current of a transistor), and analog controls (e.g., a current mirror controlled by an analog input.) In some embodiments, all elements are adjusted together, as by interconnecting control inputs 214, 215, 216 to produce a single control input as shown as 125 in FIG. 1. Some adjustment components may be interconnected, while others can be maintained independently, allowing trimming or compensation adjustment for individual element variations to be performed.

Gated Oscillators

Another variation of a ring oscillator is shown as 230 in FIG. 2B, labeled "Prior Art". In this example, one element 234 of the serially-connected buffer circuits is replaced by a logic gate, allowing an external Enable input 221 to control ring oscillation. In this particular example, when Enable goes high, oscillation begins, providing a fixed phase relationship between the Enable signal edge and the initial clock edge. When a VCO, such as VCO 130, is replaced with ring oscillator variation 230 into a Phase Locked Loop, initialization can be performed quickly, as well as reset or renormalization of the loop. However, such initialization requires stopping oscillation, and starting again at a single known initial state, e.g. with output 231 high in the example of FIG. 2B.

FIG. 2B illustrates serially-connected buffer circuit elements 242, 243, 244 for descriptive simplicity, although in a practical embodiment all elements of the ring oscillator could be identical to minimize propagation delay variations, in accordance with system requirements.

Both the basic ring oscillator and its gated oscillator variation share the same characteristic: once oscillation begins, periodic clock outputs are maintained indefinitely.

Delay-Locked Loops

Referring now to FIG. 2C, also labeled "Prior Art", a Gated Oscillator 250 illustrates initial phase synchronization. As shown, the input Reference Pulse is propagated directly from chain input 261 through serially-connected buffer circuits 262, 263, 264, to chain output 253. As in the previous examples, intermediate outputs 251 and 252 are also available, and the element delays may be adjusted using control inputs 254, 255, and 256. Thus, each output transition from any output of the serially-connected buffer circuits is derived from a transition of the input Reference Pulse, plus whatever circuit propagation delay is presently configured for the intervening buffer circuits.

As no ongoing or continuous oscillation occurs, the gated oscillator configuration is typically referred to as a delay line or tapped line rather than an oscillator. A closed loop feedback circuit using a gated oscillator can be referred to as a Delay Locked Loop or DLL. Unlike the previous examples, the duration of continued output transitions from the delay line are limited in the absence of further input transitions to the overall propagation time of the Reference Pulse. Serially-connected buffers can be implemented to produce the delay.

Once input transitions end, transitions captured in the delay line "drain out" and are not replenished. However, rising and falling input transitions are equally accommodated by the delay line, thus providing an additional degree of initialization freedom compared to the previously described gated oscillator.

In practical embodiments, the closed loop behavior of such a DLL will typically be designed to drive the adjustable delay of the tapped delay line to coincide with the repetition rate of the incoming Reference Pulse. Therefore, as one pulse exits the chain output, the next pulse will be about to enter the chain input, providing clock continuity.

PLL Advancement

Referring back to FIG. 1, a block diagram of a conventional Phase-Locked Loop (PLL) represents a type of PLL widely used to synthesize clock signals. The phase of Reference Clock 105 is compared 110 to the phase of a signal 155 derived from the oscillation of a Voltage Controlled Oscillator 130. The resulting phase error 115 integrated by low pass filter 120 produces error signal 125, for adjusting the frequency of VCO 130. In one configuration, digital clock divider 150 divides the transition rate of the VCO output by an integer ratio, for example 1:8, to produce phase comparator input 155. In that example, the feedback loop will stabilize (i.e. the loop will be "locked") with the VCO operating at 8× the Reference Clock rate and with a fixed phase relationship. Such PLL circuits are widely used to synthesize a High Frequency Clock at a multiple of an existing Reference Clock frequency.

As with the overall PLL architecture, a wide range of variations are possible for PLL component elements, including Phase Detectors, Filters, and VCOs. One known design for VCO 130 is a ring oscillator, a serially-connected chain of buffer circuits having a propagation delay capable of adjustment by the PLL error signal. Such a ring oscillator, detailed as 230 of FIG. 2B, may also produce multiple phases of overlapping square wave output signals (e.g. via outputs 231, 232, 233) which, in accordance with embodiments described herein, can be used directly, or combined by digital logic (as in 140 of FIG. 1 operating on multiple VCO output phases 135) to produce periodic waveforms having modified duty cycles and/or overlap characteristics.

Initializing VCO Phase

A Phase-Locked Loop synthesizes a high frequency output clock from a lower frequency reference clock and requires a correspondingly large in-loop division ratio, leading to a lag between VCO frequency changes and a resulting transition edge as input to the Phase Detector. The effects of such a closed-loop bandwidth limitation can include slow frequency settling times, particularly after transient phase changes of the Reference input.

Figure 3:
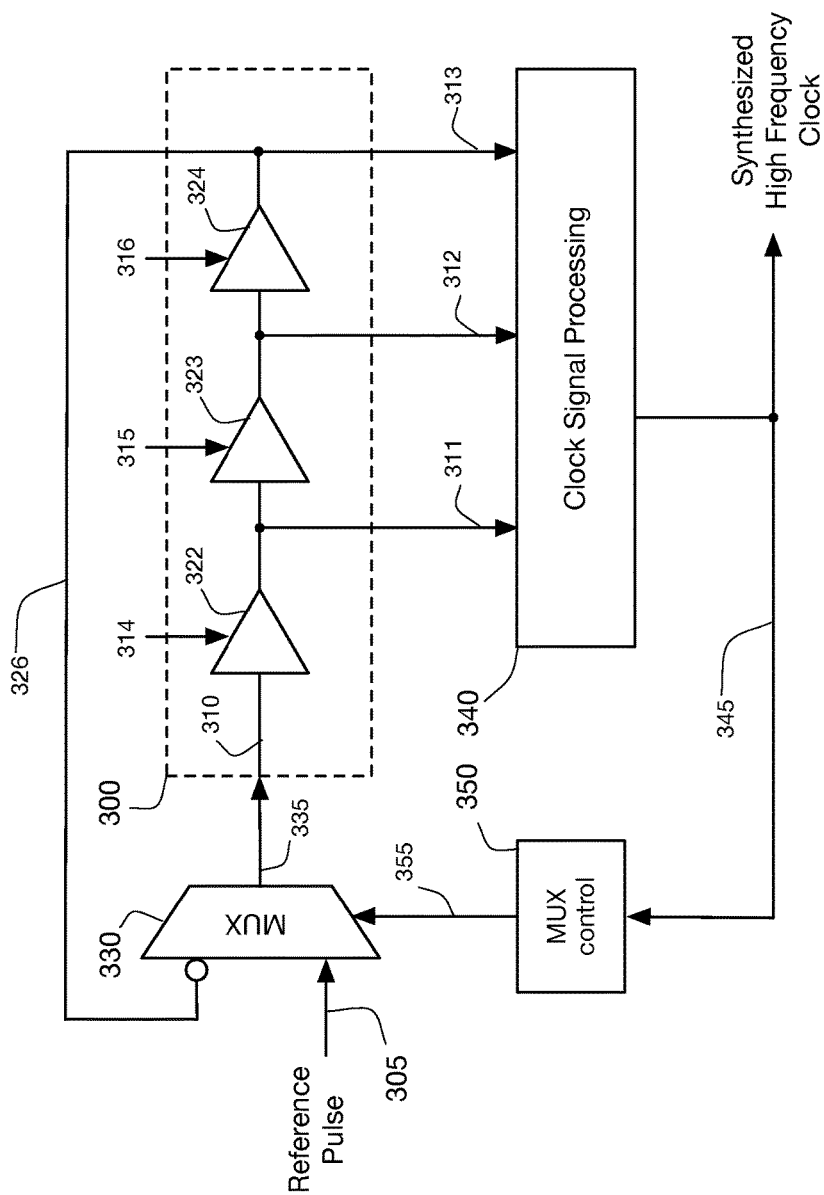
FIG. 3 shows one embodiment of a clock generator capable of operating in two modes.

In accordance with an embodiment, FIG. 3 illustrates a clock generator of with several features that mitigate issues of prior art PLLs. As with a conventional VCO ring oscillator, clock generator 300 is a buffer chain having a plurality of serially-connected buffer circuits, having a chain input 310 and chain output 313. Optionally, additional chain outputs 311, 312 may be taken from other points in the buffer chain. Each buffer 322, 323, 324 in the series-connected chain of buffers may have its propagation delay Td adjusted using control inputs 314, 315, 316 respectively.

In accordance with an embodiment for two modes of operation, Ring multiplexer 330 selects either chain output 326 or Reference Pulse 305 obtained from a reference clock circuit as input to buffer chain 300, producing two distinct operational modes.

In the first mode, 305 is selected as the input source, and a transition edge of a Reference Pulse propagates through clock generator 300, including the delays of serially-connected buffers 322, 323, 324, producing output transitions on 311, 312, 313 after 1×Td, 2×Td, or 3×Td delays, respectively.

In the second mode, chain output 326 is selected as the input source, causing the state of chain output 326 (with an inversion at input to 330) to become the chain input, producing a continuous square wave ring oscillation having a half-period of 3×Td.

The propagation delay of the buffer circuits may be changed, as examples offered without limitation, by adding or removing resistive, capacitive, or inductive loads within or between stages, by increasing or decreasing the output current driving the next stage, and by increasing or decreasing the switching threshold of the digital logic elements. Although a control voltage or current is typically the primary mechanism for adjustment, alternative embodiments may incorporate a combination of digitally switched configurations (as one example, adding fixed capacitance values), digitally controlled analog configurations (as through a Digital-to-Analog converter or DAC adjusting the operating current of a transistor), and analog controls (a current mirror controlled by the analog input.) In some embodiments, all elements can be adjusted together, as by interconnecting control inputs 314, 315, 316 of FIG. 3 to produce a single control input. In other embodiments, some adjustment components can be interconnected, while others are maintained independently, allowing trimming or compensation adjustment for individual element variations to be performed.

Multiple output phases may be taken from 300 and optionally manipulated using digital logic 340 to produce the desired duty cycle and transition density in the synthesized High Frequency Clock 345.

As with previous examples, neither the exemplary number of serially-connected buffer circuits nor their individual or collectively described composition implies a limitation; an odd number of inversions is required within the closed loop of the second mode, but no limitation is implied by either its illustrated location or described means of implementation.

PLL Integration

Figure 4:
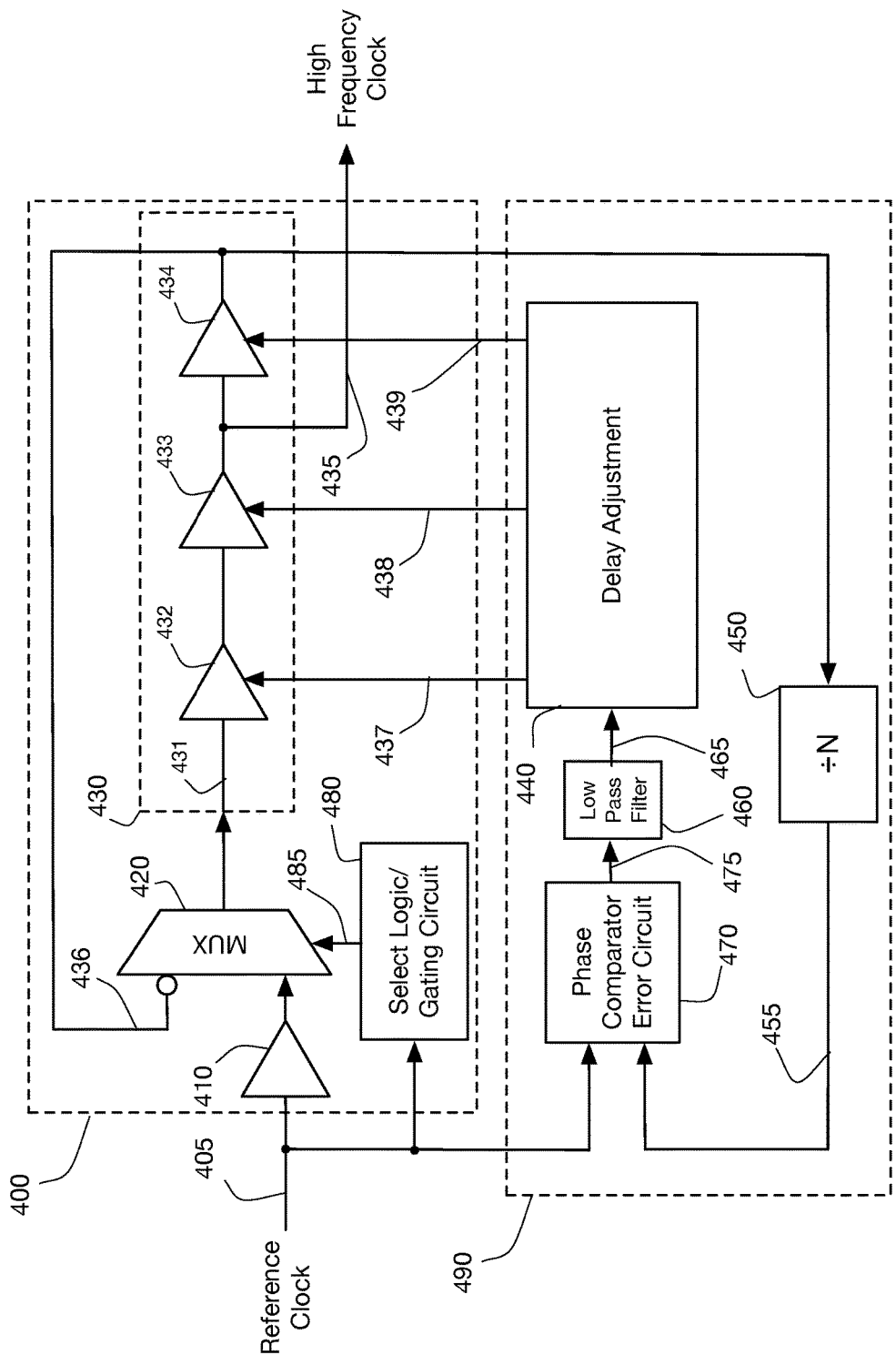
FIG. 4 shows one embodiment of a PLL utilizing the clock generator of FIG. 3.

Embodiments described with reference to FIG. 4 include architectures of phase-locked loops that operate in different modes. Specifically, one embodiment of a clock generation PLL utilizing the circuit of FIG. 3 is designed to generate a 640 MHz local clock phase-locked to an 80 MHz reference crystal oscillator signal. As shown in FIG. 4, the VCO 400 is comprised of a buffer chain 430 having a plurality of serially-connected buffer circuits and having a chain input and a chain output, and ring multiplexer 420, embodying the clock generator described above with reference to FIG. 3.

One embodiment for a PLL generates a reference clock gating signal 485 using a reference clock gating circuit. A first ring-oscillator-injection mode uses the reference clock gating signal 485 to disable a first buffer input signal 436 from ring oscillator 430 and enable a reference clock injection buffer 410. For example, select logic 480 can determine which mode via multiplexer 420.

Thus, the first buffer signal 436 and the injection buffer 410 can have parallel connected outputs that connect to a next buffer input, represented by signal 431. In one embodiment, injection buffer 410 receives a reference clock transition of a reference clock signal and injects it into a next buffer. In a second mode, a ring-oscillator-closed-loop mode uses the reference clock gating signal 485 to enable a first buffer and disable the reference clock injection buffer 410.

The chain of buffers 430, and any additional buffers can be organized as a plurality of serially-connected buffers. That way, buffers 430 induce an adjustable delay to a digital input signal. The plurality of serially-connected buffers 430 can be configured as a delay element to induce an adjustable delay to a digital input signal. In one embodiment, input to the delay element is periodically switched between a reference clock signal 405 and the delay element output 436, the first mode producing immediate phase alignment between a reference clock transition and a delay element output transition, and the second mode maintaining periodic delay element transitions independent from the reference clock signal 405.

Thus, VCO 400 may operate in a first mode, in which Reference Clock 405 is obtained from a reference clock circuit and presented through delay injection buffer 410, which can be selected via select logic 480 by ring multiplexer 420 to drive the serially-connected buffer chain input. In the first mode of operation, the circuit functions as a delay line, with Reference Clock transitions propagating through the serially-connected buffer chain with a propagation delay Tp for each buffer in the series chain.

The VCO may operate in a second mode, wherein serially connected buffer chain output 436 is selected by ring multiplexer 420 to drive the serially-connected buffer chain input 431. In the second mode of operation, the circuit can function as a ring oscillator producing square wave oscillations with an overall period of 6×Tp. An odd number of logical inversions is maintained through the resulting closed signal loop in this second mode of operation to insure ring oscillation. In one embodiment, buffers 432, 433, 434, and multiplexer 420 utilize differential inputs and outputs, with inversion produced by reversing the differential connection pair interconnecting buffer 434 and multiplexer 420.

In one embodiment, PLL-like local control loop sets and maintains the propagation delay through the serially-connected buffers 432, 433 and 434 to correspond with the desired High Frequency Clock frequency. For example, a three element ring oscillator producing a 640 MHz square wave output requires each buffer element to have a propagation delay of approximately 260 picoseconds. To set this delay, Frequency Divider 450 divides the High Frequency Clock produced by the VCO to produce a local comparison clock 455 of the same frequency (when the control loop achieves lock) as the Reference Clock. For the present example, the divide ratio of 450 would thus be 1:8, i.e. an eight-count digital counter. In some embodiments, this divide ratio is configurable, allowing adjustment for different Reference Clock and/or High Frequency Clock frequencies.

Phase Comparator 470 compares the phase (or optionally, phase and frequency) of the local comparison clock and the Reference Clock, producing error result 475, which in some embodiments may additionally be filtered by Low Pass Filter 460, in either case producing delay error 465. This comparison may be of a rising edge of the reference clock signal with a rising edge of the local comparison clock, falling edges of the two clock signals, or both. This delay error signal is used by Delay Adjustment 440 to adjust (437, 438, 439) the propagation delays of VCO series-connected buffers 432, 433, 434. In some embodiments, a portion of this adjustment is performed by a software algorithm operating on a processor or embodied in a finite state machine. As a descriptive example offered without implying limitation, rough delay adjustment might be made by configuring capacitive loading to be added or removed from circuit nodes within the buffer elements, fine delay adjustments by configuring changes to supply current using a digital-to-analog converter, while switching thresholds are modified by direct injection of current proportional to delay error 420. In another embodiment, a simplified delay adjustment circuit may adjust a current value (e.g. supply current) for one or more of the buffer circuits of the buffer chain.

Unlike a conventional PLL, where such a PLL-like local control loop is the only mechanism available to both set oscillator frequency and to set and maintain the output phase of the high frequency clock relative to the reference clock, the dual mode behavior of embodiments herein of a VCO may be used to directly set and maintain output phase. As with the simple delay line of a DLL, the dual mode VCO may be configured to be initialized by either the rising or falling edge of the Reference Clock input, or indeed by both edges in alternation. Unlike such a simple delay line, the dual mode VCO may subsequently be configured to continue oscillation, as examples either between Reference Clock input transitions, or independent of them.

In one embodiment, ring multiplexer input selection is performed by select logic 480 embodied as a reference clock gating circuit causing ring multiplexer 420 to selectively enable a Reference Clock signal (i.e. the previously-described first operating mode of the VCO) in anticipation of a rising edge transition of the Reference Clock 405, thus allowing that rising edge to be injected into the chain input of series-connected buffers 430.

In one embodiment, this anticipation is obtained by delaying the Reference Clock edge to Multiplexer 420 by routing it through delay injection buffer 410, allowing time for Select Logic/reference clock gating circuit 480 to function. The rising edge of Reference Clock 405 thus produces a rising edge on the High Frequency Clock output 435 approximately 2×Tp or 520 picoseconds later, given the illustrated output tap configuration of 430.

Select Logic/reference clock gating circuit 480 subsequently switches ring multiplexer 420 back to restore the VCO second operating mode in less than 3×Tp to permit subsequent cycles of the ring oscillator to continue independently, until the next rising edge of Reference Clock 405. Thus, the VCO combines the direct phase adjustment capability of a Delay Line, with the free-running oscillation capability of a ring oscillator, permitting it to be used in a frequency multiplication PLL without need for an extremely long and accurately adjusted delay line.

In a another embodiment, the estimated time of the reference clock transition is determined by counting a number N−1 of ring oscillator cycles after receiving a prior reference clock transition, wherein the ring oscillator operates at a frequency of N times a frequency of the reference clock signal.

In another embodiment, Select Logic is controlled by clock 455 produced by frequency divider 450, which is clocked by a ring oscillator output and configured to divide the ring oscillator clock signal by a predetermined ratio. Using the present example of a divide-by-8 function at 450, the VCO is phase initialized by Reference Clock, free runs for the remainder of the clock divider interval, and then is readied to be phase initialized again. In a further embodiment, this logic is modified so that the VCO is phase initialized by every other rising edge of Reference Clock 405, or at other lower rate.

In a further embodiment, the VCO is phase initialized only at system startup or as part of a transient recovery operation, with ongoing maintenance of clock phase maintained by conventional PLL action.

The specific examples of three buffers in 430, initialization at the rising edge of Reference Clock, clock extraction from an intermediate tap, and an overall 8× clock multiplication were made for illustrative purposes, and do not imply limitation.

VCO Embodiment

Figure 5A:
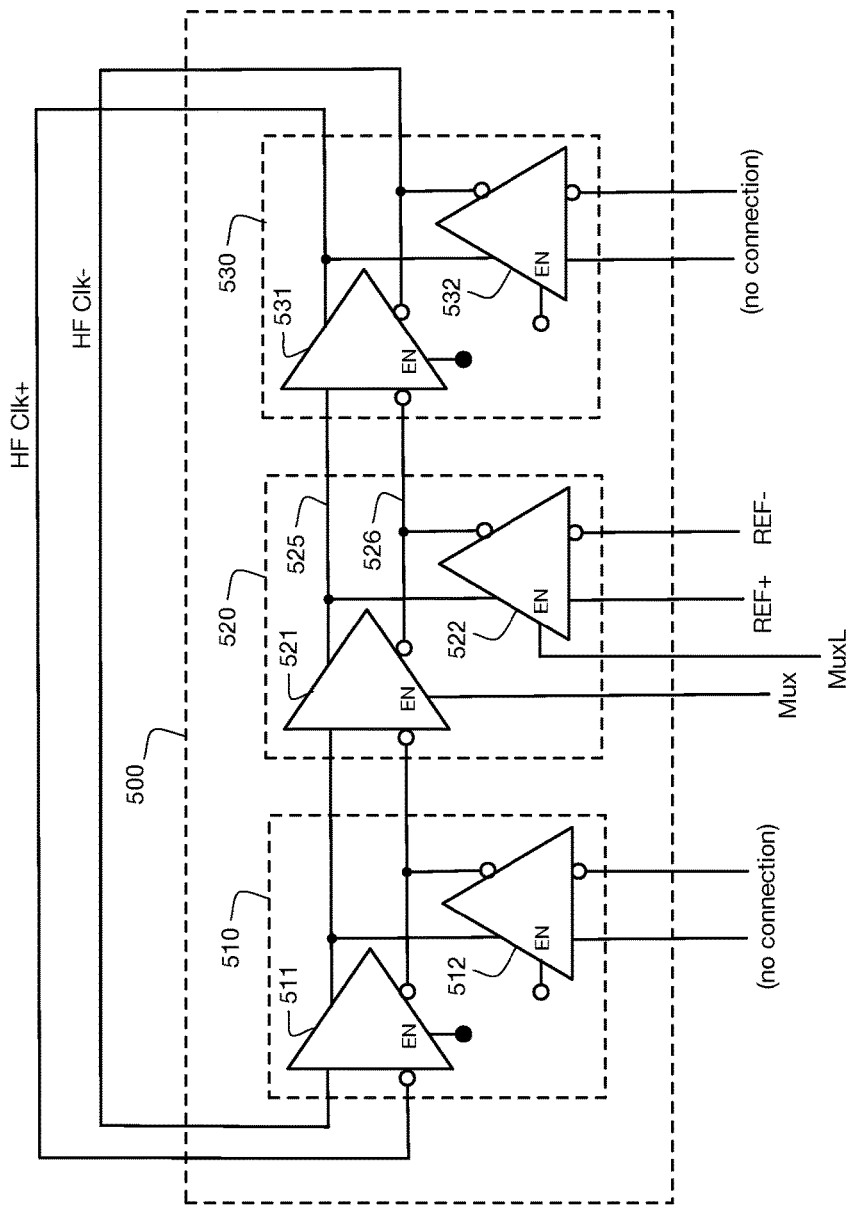
FIGS. 5A and 5B show another embodiment of a clock generator.

Another embodiment of the VCO embodiment 400 of FIG. 4 is shown in FIG. 5A. This functionally equivalent embodiment simplifies the overall design and improves its performance. As shown in FIG. 5A, all stages 510, 520, 530 of the serially-connected set of buffer circuits 500 are identical, leading to reduced oscillator output harmonics. Using stage 520 as an illustrative example, the output stage of serially-connected buffer 521 may be tri-stated using control signal Mux, with an identical tri-state "injection" buffer 522 enabled by complementary control signal MuxL tied to the same output nodes 525, 526, the enabling of one output or the other providing the multiplexer function. For stages 510 and 530, the tri-state controls are configured to continuously enable the series-connected buffer and disable the associated injection buffer. In 500, these are respectively illustrated as being hard-wired to Vdd (logic high) and Vss (logic low) respectively. In a further embodiment, disabled injection buffers 512 and 532 are not instantiated. As in the previous examples, the use of three series-connected buffer elements does not imply limitation.

Figure 5B:
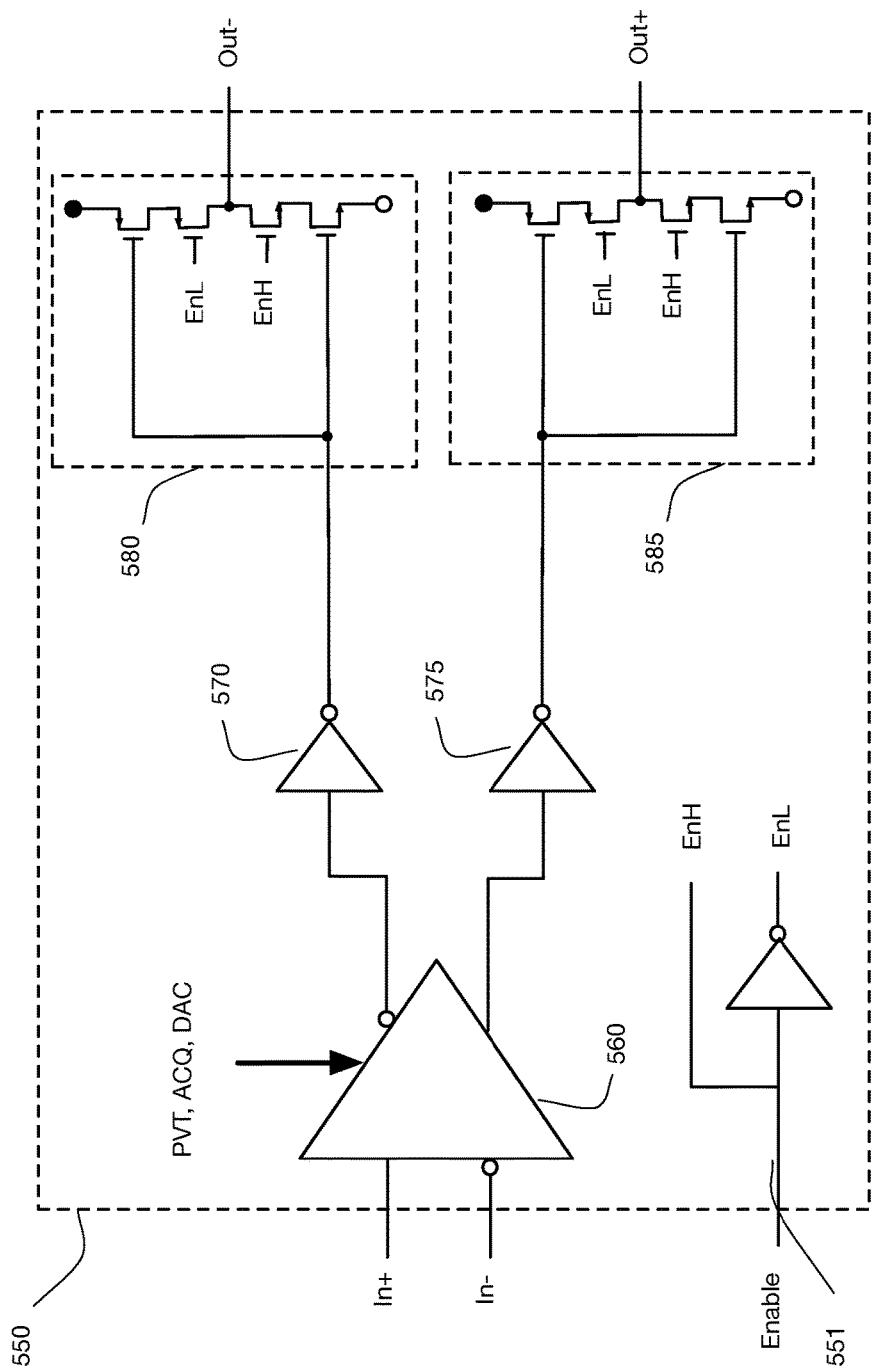

FIG. 5B illustrates an embodiment of a buffer circuit 550. Each buffer circuit 511, 521, 531, 512, 522, 532 are comprised of a differential comparator and an output enable circuit. Differential input stage 560 outputs are buffered 570, 575 and presented to tri-stateable output drivers 580, 585, controlled by internal enable signals EnH and EnL derived from external control signal Enable. In one embodiment, delay adjustment controls PVT, ACQ, and DAC manipulate delay parameters within 560 to provide configurable propagation delay adjustment. In a further embodiment, the delay adjustment controls for the buffer circuit used as the injection buffer are configured to be comparable to those of a serially-connected buffer.

In one embodiment, FIG. 5A shows a ring oscillator 500 comprised of a plurality of serially-connected buffers 510, 520, 530 as a buffer chain and a ring multiplexer comprised of parallel-connected buffer 521 and injection buffer 522, the serially-connected buffer circuits being circularly connected via a ring input provided by buffer 521. Reference clock REF+ REF− is connected via injection buffer 522.

As described in association with FIG. 4, reference clock gating circuit 480 connects to the selection input of the ring multiplexer through an enable circuit that alternately enables either parallel-connected buffer 521 or injection buffer 522 outputs, either maintaining the serial ring connection, or disconnecting the ring input and connecting the reference clock output, to selectively inject a reference clock signal. The selective injection timing may be constrained to a gating window or other restricted timing interval.

Ring oscillator error circuit 470 accepts as inputs of the Reference Clock 405 and a local clock signal 455 derived by frequency divider 450 from a ring oscillator output, and produces an error circuit output. The serially-connected buffer circuits of the ring oscillator are configured to receive a delay control signal based on the error circuit output.

Thus, an embodiment is directed to an apparatus with a buffer chain having a plurality of serially-connected buffer circuits 510, 520 and 530 in FIG. 5A (and circuits 432, 433 and 434 in FIG. 4) and having a chain input 431 and a chain output 436. The apparatus includes a reference clock circuit and a ring multiplexer 420 having an injection input connected to the reference clock circuit and a ring input connected to the chain output, a multiplexer output connected to the chain input, and an injection selection input. The apparatus further includes a reference clock gating circuit 480 connected to the injection selection input, the reference clock gating circuit 480 configured to generate a reference clock gating signal 485 on the injection selection input to selectively enable a reference clock signal 405 from the reference clock circuit to be injected into the chain input.

In one embodiment, with reference to FIG. 5A, the ring multiplexer includes a last buffer enable circuit (Mux) of a last buffer 521 of the buffer chain 510, 520 and 530 and an injection buffer enable circuit (MuxL) of an injection buffer 522 the injection selection input 480 connected to the last buffer enable circuit and the injection buffer enable circuit of the injection buffer 522.

In one embodiment, a plurality of serially-connected buffer circuits 511, 521 and 531 include each of the last buffer circuit 521 and the injection buffer circuit 522, and includes a differential comparator 560 and an enable circuit 551, shown in FIG. 5B. In an embodiment, each injection buffer enable circuit of the buffer chain, is continuously enabled, so each of EN of injection buffer circuits 512, 522 and 532 are continuously enabled.

Referring back to FIG. 4, in an embodiment frequency divider 450 is connected to the serially-connected buffer circuits 432, 433 and 434 to divide a clock signal. Phase comparator error circuit 470 has inputs connected to the reference clock circuit and the frequency divider 450, and having an error circuit output 475. In one embodiment, each buffer circuit of the buffer chain 432, 433 and 434 includes a delay adjustment circuit 440 with a delay adjustment input 465 connected to the error circuit output 475, and configured to adjust a frequency of the clock signal.

The delay adjustment input 465 can adjust a current value for one or more of the buffer circuits of the buffer chain via signals 437, 438 and/or 439.

In one embodiment, an apparatus includes a ring oscillator having a plurality of serially-connected buffers 511, 521 and 531 and a ring multiplexer Mux and MuxL, the serially-connected buffers being circularly connected via a ring input of the ring multiplexer. The apparatus includes a reference clock circuit having a reference clock output connected to an injection input shown as REF+ and REF− in FIG. 5A of the ring multiplexer. A reference clock gating circuit can be connected to an output of the ring oscillator 500, and having a gating window output connected to the selection input of the ring multiplexer configured to selectively disconnect the ring input and connect the reference clock output to the ring oscillator to selectively inject a reference clock signal.

In one embodiment, a ring-oscillator error circuit 470 has inputs connected to the reference clock circuit 405 and to an output of the ring oscillator 455 to generate an error 475 by comparing a reference clock with the output of the ring oscillator. In the embodiment, each of the plurality of serially-connected buffers 432, 433 and 434 have a corresponding adjustable delay circuit 440 configured to receive a delay control signal based on the error shown as 437, 438 and 439.

In an embodiment, the ring multiplexer can simply encompass an enable circuit, such as EN shown in FIG. 5A injection buffer 522, controlled by the reference clock gating circuit via REF+ and REF−.

Figure 6:
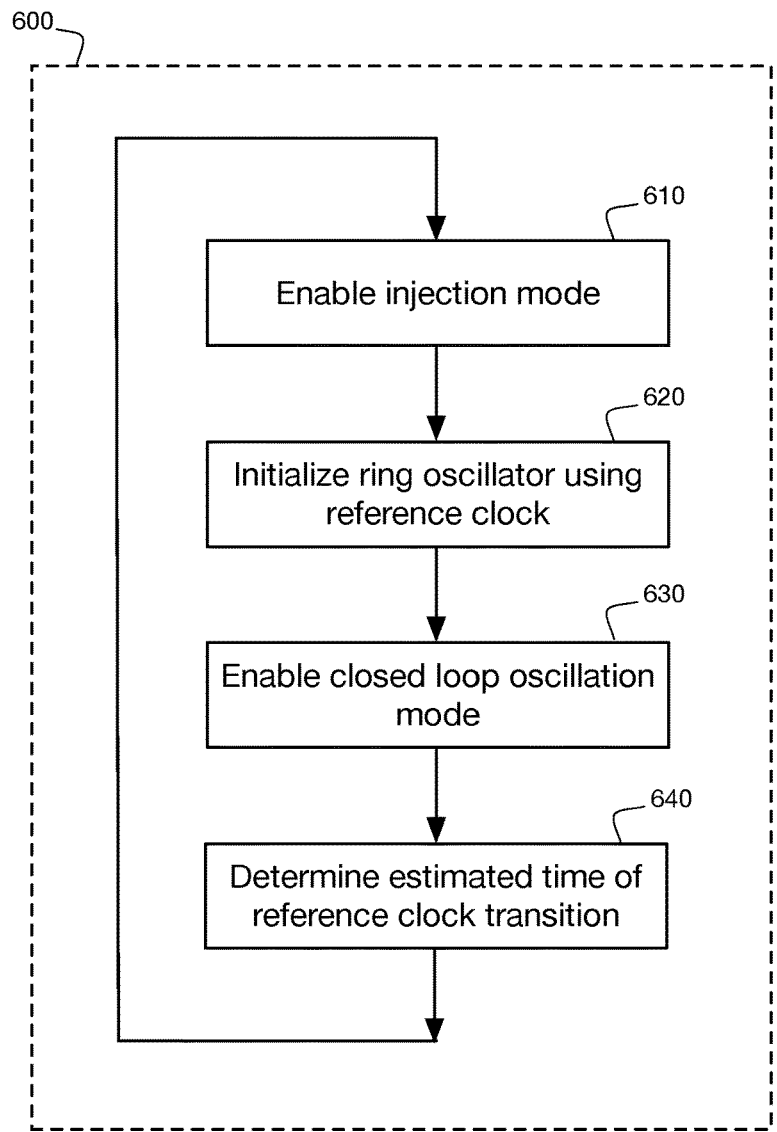
FIG. 6 is a flow chart illustrating the steps of a clock generation method.

FIG. 6 provides a flow chart summarizing the steps used to phase initialize a VCO by enabling a first or injection operating mode 610, accepting at least one reference clock input transition which sets an initial output phase, and initializing the ring oscillator using the reference clock 620. transitioning the VCO to a second or feedback operating mode by enabling closed loop oscillation mode 630 to allow continued output transitions in the absence of reference clock input transitions, and determining when another reference clock input transition is to be accepted, in anticipation of returning to the first mode by determining an estimated time of reference clock transition 640.

Descriptive terms used herein such as "voltage" or "signal level" should be considered to include equivalents in other measurement systems, such as "current", "charge", "power", etc. As used herein, the term "signal" includes any suitable behavior and/or attribute of a physical phenomenon capable of conveying information. The information conveyed by such signals may be tangible and non-transitory.

Note that various hardware elements of one or more of the described embodiments are referred to as "modules" that carry out (perform, execute, and the like) various functions that are described herein in connection with the respective modules. As used herein, a module includes hardware (e.g., one or more processors, one or more microprocessors, one or more microcontrollers, one or more microchips, one or more application-specific integrated circuits (ASICs), one or more field programmable gate arrays (FPGAs), one or more memory devices) deemed suitable by those of skill in the relevant art for a given implementation. Each described module may also include instructions executable for carrying out the one or more functions described as being carried out by the respective module, and those instructions may take the form of or include hardware (or hardwired) instructions, firmware instructions, software instructions, and/or the like, and may be stored in any suitable non-transitory computer-readable medium or media, such as commonly referred to as RAM or ROM.

Although features and elements are described above in particular combinations, one of ordinary skill in the art will appreciate that each feature or element may be used alone or in any combination with the other features and elements. In addition, the methods described herein may be implemented in a computer program, software, or firmware incorporated in a computer-readable medium for execution by a computer or processor. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

I claim:

1. A method comprising:
generating a reference clock gating signal using a reference clock gating circuit;
enabling a ring-oscillator-injection mode by using the reference clock gating signal to disable a first buffer of a ring oscillator and to enable a reference clock injection buffer, the first buffer and the injection buffer having parallel connected outputs that connect to a next buffer input of a next buffer of the ring oscillator; and,
while in the ring-oscillator-injection mode, receiving a reference clock transition of a reference clock signal at the reference clock injection buffer and injecting it into the next buffer; and,
enabling a ring-oscillator-closed-loop mode by using the reference clock gating signal to enable the first buffer and to disable the reference clock injection buffer.

2. The method of claim 1, wherein generating the reference clock gating signal comprises changing the reference clock gating signal to an enable state prior to an estimated time of the reference clock transition.

3. The method of claim 2, further comprising:
estimating the estimated time of the reference clock transition by counting a number N−1 of ring oscillator cycles after receiving a prior reference clock transition, wherein the ring oscillator operates at a frequency of N times a frequency of the reference clock signal.

4. The method of claim 1, further comprising:
configuring the next buffer and one or more additional buffers of the ring oscillator with one or more enable circuits and applying a continuous enable signal to the next buffer and to the one or more additional buffers of the ring oscillator.

5. The method of claim 1, further comprising:
generating a ring oscillator error signal; and
responsively adjusting a delay value of at least one of the next buffer and one or more additional buffers of the ring oscillator.

6. The method of claim 5, wherein the adjusted delay value is similar to a delay of the reference clock injection buffer.

7. The method of claim 5, wherein generating the ring oscillator error signal is based on the reference clock signal and a ring-oscillator output signal.

8. The method of claim 7, wherein generating the ring oscillator error signal comprises:
comparing a rising edge of the reference clock signal with a rising edge of a frequency-divided version of the ring-oscillator output signal.

9. The method of claim 8, further comprising selectively adjusting a value of a frequency divisor N used to generate the frequency-divided version of the ring-oscillator output signal according to a frequency of the reference clock signal.

10. An apparatus comprising:
a voltage controlled oscillator configured to receive a reference clock signal and to generate a system clock signal; the voltage controlled oscillator comprising a buffer chain of buffer circuit blocks, the buffer chain having a chain input and a chain output, the chain of buffer circuit blocks comprising:
an injection buffer circuit block; and
one or more additional buffer circuit blocks,
wherein each of the one or more additional buffer circuit blocks comprises a first buffer and a second buffer and wherein the injection buffer circuit block comprises an injection buffer and a delay buffer, wherein the injection buffer has an injection input and is configured to receive the reference clock signal at the injection input; and wherein the delay buffer has an input connected to the chain output of the buffer chain; and wherein the delay buffer circuit and the injection buffer circuit have parallel connected outputs that connect to the chain input of the buffer chain;
and
a selection circuit configured to generate a control signal and to provide the control signal to the injection buffer circuit block; and
wherein the injection buffer circuit block is configured to switch between a first mode and a second mode responsively to the control signal from the selection circuit,
wherein in the first mode the delay buffer is disabled and the injection buffer is enabled and is configured to provide the reference clock signal to the chain input of the buffer chain, and
wherein in the second mode the injection buffer is disabled and the delay buffer is enabled and is connected to the chain input of the buffer chain to form a closed loop with the first buffers of the one or more additional buffer circuit blocks.

11. The apparatus of claim 10 wherein the voltage controlled oscillator comprises the selection circuit.

12. The apparatus of claim 10 wherein the injection buffer circuit block is configured to receive the control signal from the selection circuit at a selection input and the control signal comprises a first and a second multiplexer control signal.

13. The apparatus of claim 12 wherein the injection buffer comprises an injection enable circuit configured to receive the first multiplexer control signal and the delay buffer comprises a delay enable circuit configured to receive the second multiplexer control signal.

14. The apparatus of claim 10 wherein the injection buffer circuit block and the one or more additional buffer circuit blocks are identically configured and wherein the second buffers of the one or more additional buffer circuit blocks are continuously disabled and the first buffers of the one or more additional buffer circuit blocks are continuously enabled.

15. The apparatus of claim 10 wherein each of the injection buffer and the second buffers of the one or more additional buffer circuit blocks comprises a differential comparator and wherein the injection buffer is configured to receive the reference clock signal at the differential comparator.

16. The apparatus of claim 10, further comprising:
a frequency divider connected to the chain output of the buffer chain and configured to receive a clock signal from the buffer chain and to divide the clock signal to generate a frequency divided clock signal; and
an error circuit configured to receive the reference clock signal and the frequency divided clock signal and to generate an error signal at an error circuit output.

17. The apparatus of claim 16, further comprising:
a delay adjustment circuit connected to the error circuit output via a low pass filter and configured to adjust a frequency of the clock signal from the buffer chain by providing delay adjustments to one or more buffer circuit blocks of the buffer chain.

18. The apparatus of claim 10, wherein the selection circuit comprises a reference clock gating circuit, the control signal comprises a reference clock gating signal, and wherein the apparatus further comprises:
a reference clock circuit configured to generate the reference clock signal and to provide the reference clock signal to the voltage controlled oscillator.

19. An apparatus comprising:
a buffer chain of buffer circuit blocks configured to generate a system clock signal, the buffer chain having a chain input and a chain output, the chain of buffer circuit blocks comprising:
   an injection buffer circuit block comprising an injection buffer enable circuit and a delay buffer enable circuit; and
   one or more additional buffer circuit blocks,
   wherein each of the one or more additional buffer circuit blocks comprises at least a first buffer and wherein the injection buffer circuit block comprises an injection buffer and a delay buffer, wherein the injection buffer has an injection input and is configured to receive a reference clock signal at the injection input; and
   wherein the delay buffer has an input connected to the chain output of the buffer chain; and wherein the delay buffer circuit and the injection buffer circuit have parallel connected outputs that connect to the chain input of the buffer chain; and
a selection circuit configured to generate a control signal and to provide the control signal to the injection buffer circuit block at one or more of the injection buffer enable circuit and the delay buffer enable circuit; and
wherein the injection buffer circuit block is configured to switch between a first mode and a second mode responsively to the control signal from the selection circuit,
wherein in the first mode the injection buffer is enabled and is configured to provide the reference clock signal to the chain input of the buffer chain, and
wherein in the second mode the delay buffer is enabled and is connected to the chain input of the buffer chain to form a closed loop with the first buffers of the one or more additional buffer circuit blocks.

20. An apparatus comprising:
a buffer chain having a plurality of serially-connected buffer circuits and having a chain input and a chain output;
a ring multiplexer having an injection input, a ring input connected to the chain output, a multiplexer output connected to the chain input, and an injection selection input, the injection input configured to receive a reference clock signal, wherein the ring multiplexer comprises (i) an injection buffer; (ii) a last buffer enable circuit of a last buffer circuit of the buffer chain; and (iii) an injection buffer enable circuit of the injection buffer, and wherein the injection selection input is connected to the last buffer enable circuit and the injection buffer enable circuit; and
a reference clock gating circuit connected to the injection selection input, the reference clock gating circuit configured to generate a reference clock gating signal on the injection selection input to selectively enable the reference clock signal to be injected into the chain input.

* * * * *